(12) United States Patent
Yebka et al.

(10) Patent No.: US 11,363,742 B2
(45) Date of Patent: Jun. 14, 2022

(54) VARIABLE TEMPERATURE HEAT EXCHANGE SWITCH

(71) Applicant: LENOVO (Singapore) PTE. LTD., New Tech Park (SG)

(72) Inventors: Bouziane Yebka, Apex, NC (US); Philip Jakes, Durham, NC (US); Tin-Lup Wong, Chapel Hill, NC (US)

(73) Assignee: LENOVO (Singapore) PTE. LTD., New Tech Park (SG)

( * ) Notice: Subject to any disclaimer, the term of this patent is extended or adjusted under 35 U.S.C. 154(b) by 0 days.

(21) Appl. No.: 16/863,777

(22) Filed: Apr. 30, 2020

(65) Prior Publication Data

US 2021/0345524 A1 Nov. 4, 2021

(51) Int. Cl.
*H05K 7/20* (2006.01)

(52) U.S. Cl.
CPC ..... *H05K 7/20381* (2013.01); *H05K 7/20336* (2013.01); *H05K 7/20154* (2013.01)

(58) Field of Classification Search
CPC ..................................................... G06F 1/203
See application file for complete search history.

(56) References Cited

U.S. PATENT DOCUMENTS

| | | | | |
|---|---|---|---|---|
| 3,489,203 A | * | 1/1970 | Fischell | B64G 1/506 165/274 |
| 6,278,607 B1 | * | 8/2001 | Moore | G06F 1/203 361/679.54 |
| 9,453,501 B2 | * | 9/2016 | Mather | C08J 5/00 |
| 2005/0099776 A1 | * | 5/2005 | Xue | F28D 15/0266 361/700 |
| 2009/0237887 A1 | * | 9/2009 | Shibata | H05K 7/20445 361/709 |

* cited by examiner

*Primary Examiner* — Mukundbhai G Patel
(74) *Attorney, Agent, or Firm* — Kunzler Bean & Adamson; Bruce R. Needham

(57) ABSTRACT

Apparatuses, systems, devices, and methods for variable temperature heat exchange switch are disclosed. An apparatus includes a heat exchanger coupled to an electronic component to dissipate heat from the electronic component. The apparatus includes a heat pipe connected to the heat exchanger and configured to dissipate heat. An apparatus includes a thermal-activated switch located at the connection between the heat exchanger and the heat pipe. The thermal-activated switch may be configured to allow heat transfer from the heat exchanger to the heat pipe in response to a temperature satisfying a threshold temperature.

19 Claims, 5 Drawing Sheets

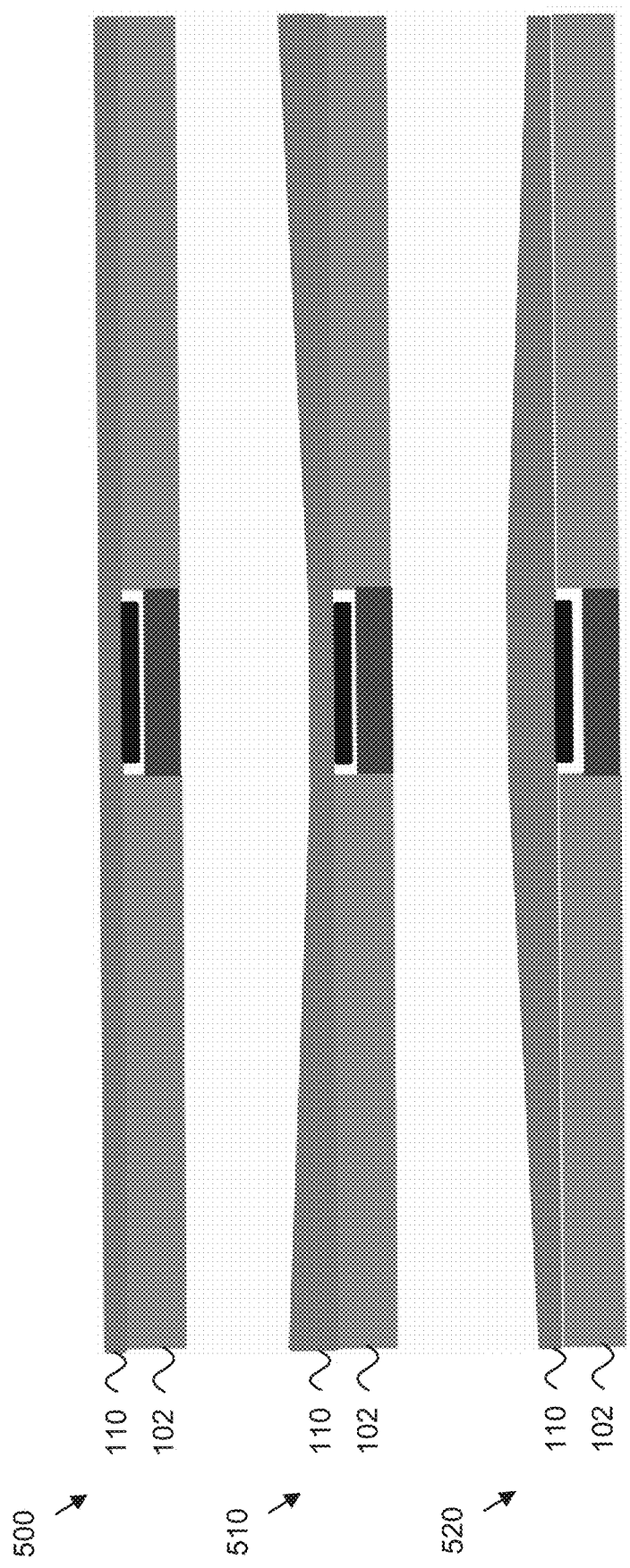

VARIABLE TEMPERATURE HEAT EXCHANGE SWITCH

FIELD

The subject matter disclosed herein relates to electronic devices and more particularly relates to a variable temperature heat exchange switch for electronic devices.

BACKGROUND

Electronic devices can generate heat while powered on. The heat that is generated can impact the performance and robustness of components within electronic devices, including devices that do not include cooling fans or have batteries with irregular configurations.

BRIEF SUMMARY

An apparatus for variable temperature heat exchange switch is disclosed. In one embodiment, an apparatus includes a heat exchanger coupled to an electronic component to dissipate heat from the electronic component. In further embodiments, the apparatus includes a heat pipe connected to the heat exchanger and configured to dissipate heat. In certain embodiments, an apparatus includes a thermal-activated switch located at the connection between the heat exchanger and the heat pipe. The thermal-activated switch may be configured to allow heat transfer from the heat exchanger to the heat pipe in response to a temperature satisfying a threshold temperature.

A system for variable temperature heat exchange switch is disclosed. A system, in one embodiment, includes a first electronic component and a second electronic component. In further embodiments, the system includes a heat exchanger coupled to the first electronic component to dissipate from the first electronic component without using a fan. In some embodiments, the system includes a heat pipe coupled to the second electronic component to dissipate heat from the second electronic component. In such an embodiment, the heat pipe is connected to the heat exchanger. In further embodiments, the system includes a thermal-activated switch located at the connection between the heat exchanger and the heat pipe, the thermal-activated switch configured to allow heat transfer from the heat exchanger to the heat pipe in response to a temperature satisfying a threshold temperature.

A computing device for variable temperature heat exchange switch is disclosed. The computing device, in one embodiment, includes a plurality of computing components, wherein at least a portion of the plurality of computing components are coupled to heat exchangers without being coupled to a fan to dissipate heat. In further embodiments, the computing device includes at least one heat pipe for dissipating heat from the computing device. In certain embodiments, the heat exchangers are coupled to the at least one heat pipe by thermal-activated switches. The thermal-activated switches may be configured to allow heat transfer from the heat exchangers to the heat pipe in response to a temperature satisfying a threshold temperature.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which:

FIG. 5 is a schematic flow chart diagram illustrating embodiments of a heat exchanger.

DETAILED DESCRIPTION

Figure 1:
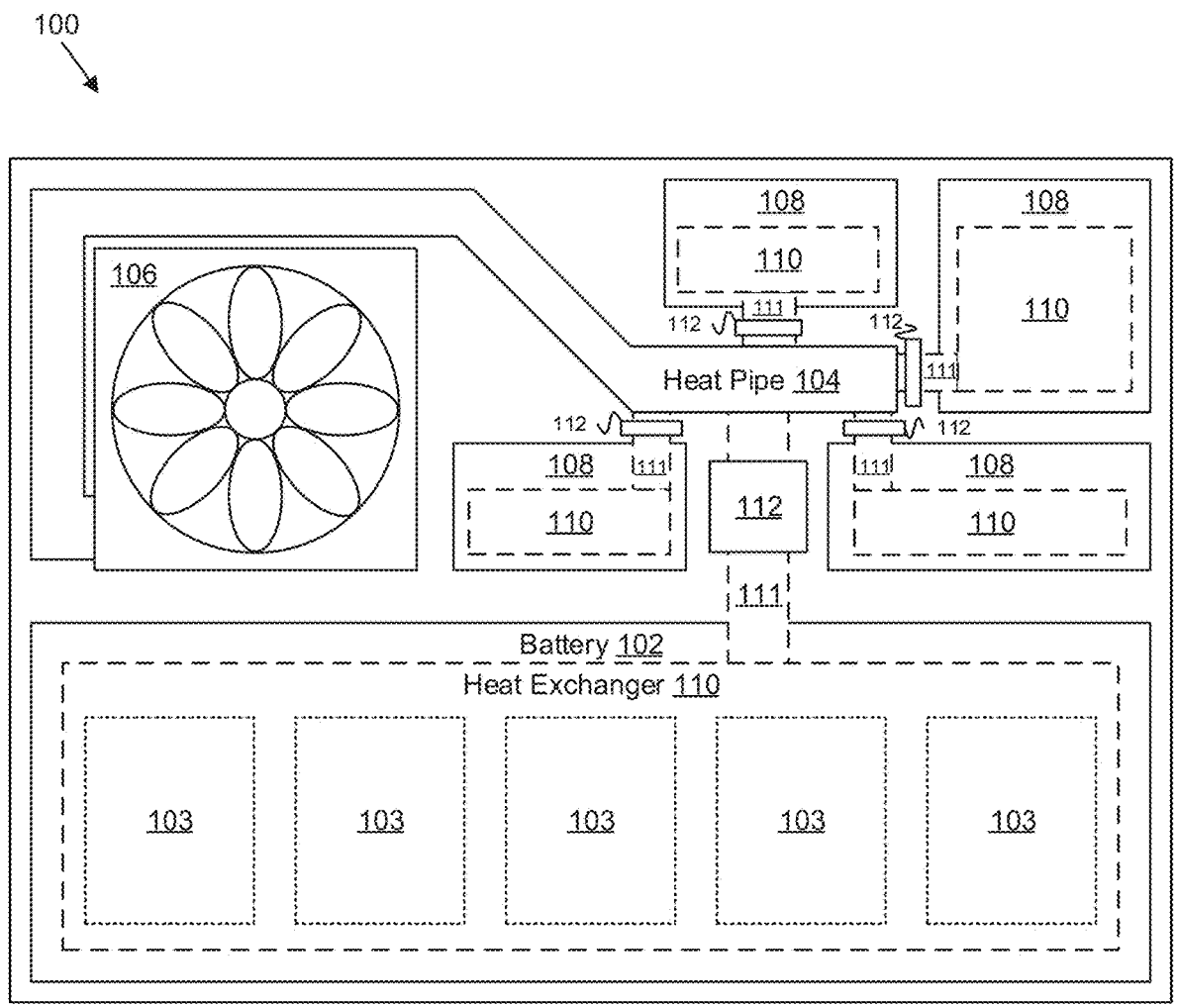
FIG. 1 is a schematic block diagram illustrating one embodiment of an interior of a computing device in accordance with the subject matter disclosed herein.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

As used herein, a list with a conjunction of "and/or" includes any single item in the list or a combination of items in the list. For example, a list of A, B and/or C includes only A, only B, only C, a combination of A and B, a combination of B and C, a combination of A and C or a combination of A, B and C. As used herein, a list using the terminology "one or more of" includes any single item in the list or a combination of items in the list. For example, one or more of A, B and C includes only A, only B, only C, a combination of A and B, a combination of B and C, a combination of A and C or a combination of A, B and C. As used herein, a list using the terminology "one of includes one and only one of any single item in the list. For example, "one of A, B and C" includes only A, only B or only C and excludes combinations of A, B and C. As used herein, "a member selected from the group consisting of A, B, and C," includes one and only one of A, B, or C, and excludes combinations of A, B, and C." As used herein, "a member selected from the group consisting of A, B, and C and combinations thereof" includes only A, only B, only C, a combination of A and B, a combination of B and C, a combination of A and C or a combination of A, B and C.

The description of elements in each figure may refer to elements of proceeding figures. Like numbers refer to like elements in all figures, including alternate embodiments of like elements.

An apparatus for variable temperature heat exchange switch is disclosed. In one embodiment, an apparatus includes a heat exchanger coupled to an electronic component to dissipate heat from the electronic component. In further embodiments, the apparatus includes a heat pipe connected to the heat exchanger and configured to dissipate heat. In certain embodiments, an apparatus includes a thermal-activated switch located at the connection between the heat exchanger and the heat pipe. The thermal-activated switch may be configured to allow heat transfer from the heat exchanger to the heat pipe in response to a temperature satisfying a threshold temperature.

In one embodiment, the thermal-activated switch comprises a bi-metallic thermostat switch that comprises two materials that are bonded together and have different coefficients of expansion based on temperature to create contact between the heat exchanger and the heat pipe in response to the temperature satisfying the threshold temperature. In certain embodiments, the two materials that are bonded together comprise brass and steel.

In one embodiment, the thermal-activated switch comprises a shape memory switch comprised of a material that changes shape to create contact between the heat exchanger and the heat pipe in response to the temperature satisfying the threshold temperature. In various embodiments, the material comprises chlorinated polyvinyl chloride.

In one embodiment, the thermal-activated switch comprises a bi-metallic snap switch that snaps a material into place to create contact between the heat exchanger and the heat pipe in response to the temperature satisfying the threshold temperature. In certain embodiments, the thermal-activated switch is a one-way switch such that heat is transferred from the heat exchanger to the heat pipe and not from the heat pipe to the heat exchanger.

In one embodiment, the heat exchanger substantially covers an external surface area of the electronic component. In certain embodiments, the heat exchanger comprises one of a heat spreader and a heat sink. In further embodiments, the heat exchanger is asymmetrically designed based on a heat map of the electronic component such that the heat sink is configured to dissipate more heat from hotter areas of the electronic component than cooler areas.

In one embodiment, the heat exchanger is designed based on a heat map of the electronic component such that the heat exchanger is configured to dissipate more heat from hotter areas of the electronic component than cooler areas. In certain embodiments, the heat exchanger is designed such that portions of the heat exchanger that cover hotter areas of the electronic component are thicker than other portions of the heat exchanger that cover cooler areas of the electronic component.

In one embodiment, the electronic component comprises a battery. In some embodiments, the threshold temperature is within a range of 60-70 degrees Celsius. In various embodiments, the threshold temperature is 65 degrees Celsius. In one embodiment, the electronic component is free of a fan for dissipating heat.

A system for variable temperature heat exchange switch is disclosed. A system, in one embodiment, includes a first electronic component and a second electronic component. In further embodiments, the system includes a heat exchanger coupled to the first electronic component to dissipate from the first electronic component without using a fan. In some embodiments, the system includes a heat pipe coupled to the second electronic component to dissipate heat from the second electronic component.

In such an embodiment, the heat pipe is connected to the heat exchanger. In further embodiments, the system includes a thermal-activated switch located at the connection between the heat exchanger and the heat pipe, the thermal-activated switch configured to allow heat transfer from the heat exchanger to the heat pipe in response to a temperature satisfying a threshold temperature.

In one embodiment, the thermal-activated switch comprises a bi-metallic thermostat switch that comprises two materials that are bonded together and have different coefficients of expansion based on temperature to create contact between the heat exchanger and the heat pipe in response to the temperature satisfying the threshold temperature.

In one embodiment, the thermal-activated switch comprises a shape memory switch comprised of a material that changes shape to create contact between the heat exchanger and the heat pipe in response to the temperature satisfying the threshold temperature.

In certain embodiments, the thermal-activated switch comprises a bi-metallic snap switch that snaps a material into place to create contact between the heat exchanger and the heat pipe in response to the temperature satisfying the threshold temperature.

A computing device for variable temperature heat exchange switch is disclosed. The computing device, in one embodiment, includes a plurality of computing components, wherein at least a portion of the plurality of computing components are coupled to heat exchangers without being coupled to a fan to dissipate heat. In further embodiments, the computing device includes at least one heat pipe for dissipating heat from the computing device. In certain embodiments, the heat exchangers are coupled to the at least one heat pipe by thermal-activated switches. The thermal-activated switches may be configured to allow heat transfer from the heat exchangers to the heat pipe in response to a temperature satisfying a threshold temperature.

FIG. 1 is a schematic block diagram illustrating one embodiment of an interior of a computing device 100 in accordance with the subject matter disclosed herein. In one embodiment, the computing device 100 includes various components such as a battery 102, a heat pipe 104, a fan 106, hardware components 108 (e.g., processors, memories, storage devices, peripheral devices, and/or the like), heat exchangers 110, heat transfer channels/junctions 111, and thermal-activated switches 112, which are described in more detail below.

In one embodiment, the computing device 100 may be a consumer electronic device such as a laptop computer, a desktop computer, a set-top box, a gaming console, a security system, a smart phone, a tablet computer, a smart watch, a smart speaker, a television, a security system, a kitchen appliance, a garage door opener, a component in a vehicle, and/or the like. The computing device 100 may be a portable or mobile device that includes a battery 102, or multiple batteries 102, for powering the computing device 100.

The battery 102, in certain embodiments, is a rechargeable battery, e.g., a lithium-ion battery, and includes multiple cells 103 that each generate a certain amount of heat while the computing device 100 is powered on and/or actively used and drawing power from the battery 102. The battery 102 may have a conventional or consistent configuration or may have an irregular or inconsistent configuration, e.g., the cells 103 of the battery 102 may have different characteristics, e.g., different dimensions or the like, that may impact how heat is generated in the battery 102, the locations of the heat regions in the battery 102 (e.g., the head gradient), and/or the like.

In further embodiments, the computing device 100 includes a heat pipe 104 that is coupled to a fan 106 for dissipating heat from various components 108 of the computing device 100 and out of or away from the computing device 100. A heat pipe 104, as used herein, is a heat-transfer device that combines the principles of both thermal conductivity and phase transition to effectively transfer heat between two solid interfaces.

In certain embodiments, at the hot interface of a heat pipe 104 a liquid in contact with a thermally conductive solid surface turns into a vapor by absorbing heat from that surface. The vapor then travels along the heat pipe 104 to the cold interface, e.g., the fan 106, and condenses back into a liquid-releasing the latent heat. The liquid then returns to the hot interface through either capillary action, centrifugal force, or gravity, and the cycle repeats.

In certain embodiments, even though a fan 106 is depicted in the computing device 100 of FIG. 1, one of skill in the art will recognize, in light of this disclosure, that some computing devices 100 may not have a fan 106, such as compact devices like smart phones, tablet computers, smart watches, and/or the like. In such embodiments, heat pipes 104 may still be used as a way to dissipate heat from various components 108 of the computing device 100.

The components 108 may include various hardware components of a computing device 100 such as processors, memories, storage devices, network cards, graphics cards, sounds cards, chips, field programmable gate arrays, application-specific integrated circuits, and/or the like.

The heat exchangers 110, in one embodiment, may include a heat sink, a heat spreader, and/or the like. As used herein, a heat sink is a passive heat exchanger 110 that transfers the heat generated by an electronic or a mechanical device to a fluid medium, often air or a liquid coolant, where it is dissipated away from the device. Similarly, a heat spreader, as used herein, transfers energy as heat from a hotter source to a colder heat sink or heat exchanger, e.g., a heat pipe 104. An example of a heat spreader is a plate or block of material having high thermal conductivity, such as copper, aluminum, or diamond.

In the depicted embodiment, heat exchangers 110 (e.g., a heat sink or heat spreader) are located on the battery 102 and/or the hardware components 108. The heat exchangers 110 may be adhered to the battery 102 and/or the hardware components 108 (e.g., with thermal glue), integrated with the battery 102 and/or the, and/or the like. The heat exchangers 110 may cover a substantial portion, if not all, of the exterior surface areas of the battery 102 and/or the hardware components 108 to draw heat from generally all portions of the battery 102 and/or hardware components 108.

In further embodiments, the heat exchangers 110 may be coupled to the heat pipe 104 by junctions 111, which may be comprised of the same material as the heat pipe 104 and/or the heat exchangers 110. The junctions 111 may be adhered or fixed to the heat exchangers 110 and the heat pipe 104. Thermal-activated switches 112 may be located along the junctions 111 between the heat exchangers 110 and the heat pipe 104 to prevent and allow heat transfer from the heat exchangers 110 to the heat pipe 104 via a junction 111 and a thermal-activated switch 112.

As described in more detail below with reference to FIGS. 2-4, a thermal-activated switch 112, as used herein, may comprise a device that opens at high temperature (above a predefined threshold) and closes when the temperature drops (e.g., below the predefined threshold). As disclosed herein, when a thermal-activated switch 112 opens, heat is allowed to transfer from the heat exchanger 110 to the heat pipe 104 for dissipating heat from the battery 102 and/or the hardware components 108.

The threshold temperature for activating the thermal-activated switch 112 may be within a range of 60-70 degrees Celsius and may be 65 degrees Celsius. In one embodiment, a thermal-activated switch 112 is a one-way switch such that heat is transferred from a heat exchanger 110 to the heat pipe 104, and not from the heat pipe 104 to the heat exchanger 110.

In this manner, inconsistencies in the heat map or heat gradient of the battery 102 and/or the hardware components 108 can be minimized during use so that the heat gradient of the battery 102 and/or the hardware components 108 is more consistent throughout the battery 102 and/or the hardware components 108. In other words, for example, heat can be transferred from hotter regions of the battery 102 so that the battery 102 does not have hot spots that impact the battery's efficiency and life.

In further embodiments, the connection between a heat exchanger 110 and the heat pipe 104 via the thermal-activated switch 112 allows for heat transfer during startup of the computing device 100 in low temperature conditions so that safety mechanisms, e.g., auto shut down signals, are not triggered in response to the battery 102 going from a low temperature to a high temperature in a very short amount of time.

Figure 2:
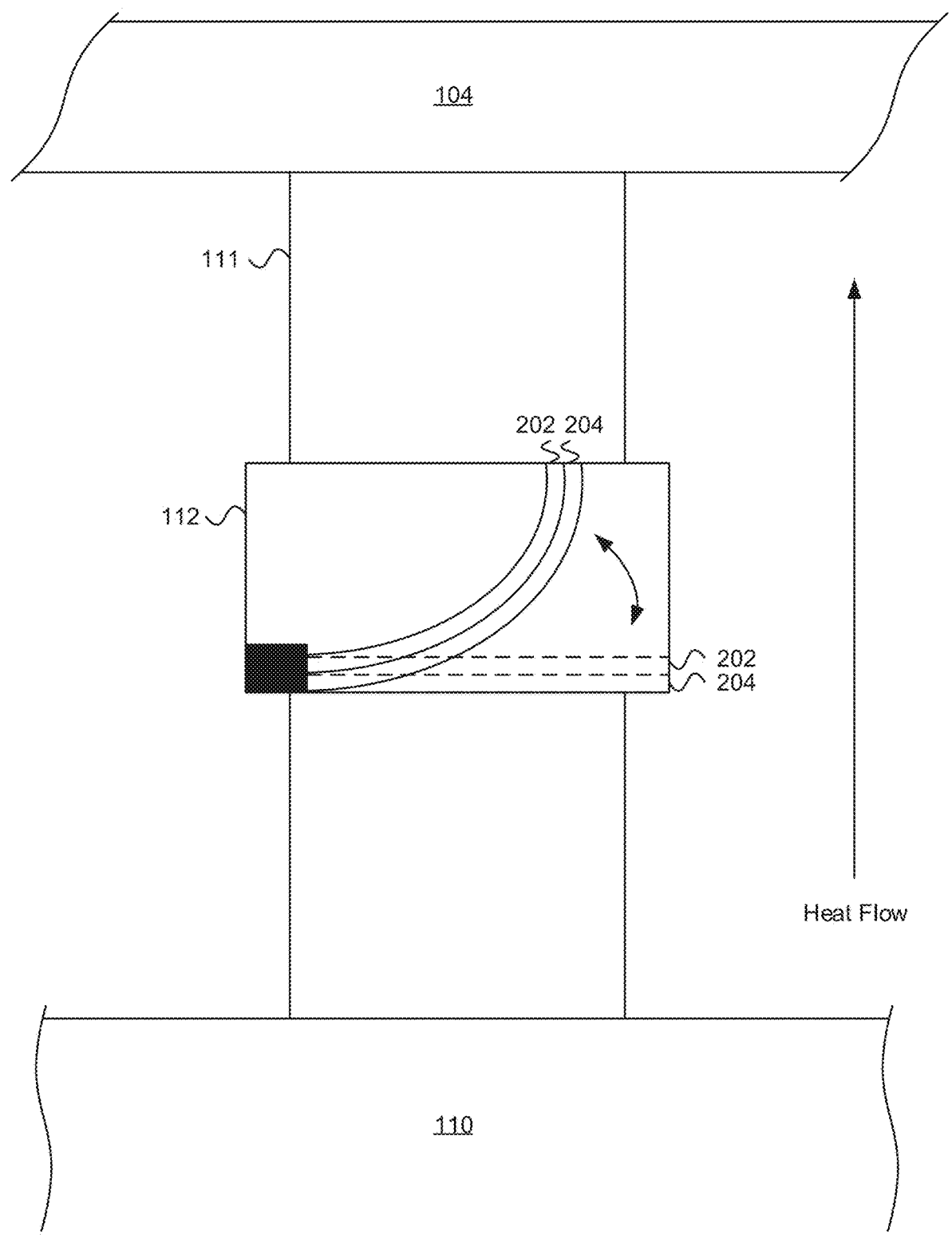
FIG. 2 is a schematic block diagram illustrating one embodiment of a thermal-activated switch in accordance with the subject matter disclosed herein.

FIG. 2 is a schematic block diagram illustrating one embodiment of a thermal-activated switch 112 in accordance with the subject matter disclosed herein. In one embodiment, the thermal-activated switch 112 may include a bi-metallic switch. The bi-metallic switch may include two-different materials 202, 204 that are bonded together. Each material 202, 204 may have a different coefficient of expansion such that when the temperature satisfies the coefficient of expansion of one of the materials, the materials 202, 204 may bend in a direction of the material that expands more than the other, which creates contact with the junction 111 to transfer heat from the heat exchanger 110 to the heat pipe 104.

When the temperature goes down again, e.g., below a predefined threshold, the materials 202, 204 bend back to their original state and remove contact with the junction 111 so that heat does not flow from the heat exchanger 110 to the heat pipe 104. Examples of materials that may be used and that have different coefficients of expansion include aluminum, brass, copper, steel, and/or the like.

Figure 3:
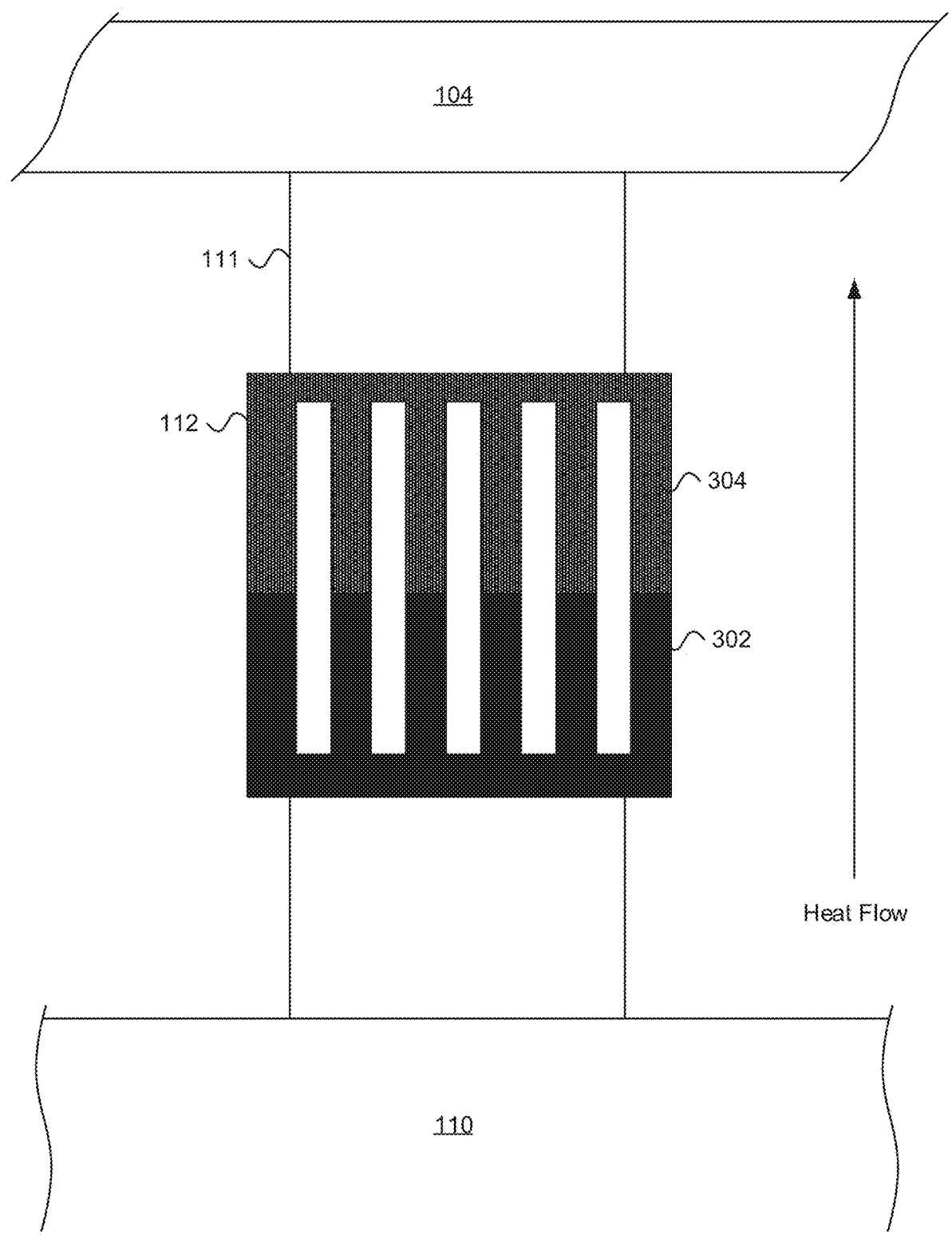
FIG. 3 is a schematic block diagram illustrating another embodiment of a thermal-activated switch in accordance with the subject matter disclosed herein.

FIG. 3 is a schematic block diagram illustrating another embodiment of a thermal-activated switch 112 in accordance with the subject matter disclosed herein. In one embodiment, the thermal-activated switch 112 may include a shape-memory alloy material 302 that is configured to change its shape in response to the temperature satisfying a predefined threshold temperature for the material 302.

The material 302 may include a material such as chlorinated polyvinyl chloride ("CPVC"), polyvinyl chloride ("PVC"), carbon steel, stainless steel, fiberglass, etc. As shown in FIG. 3, as the temperature increases on the heat exchanger 110 that is coupled to the junction 111 and the thermal-activated switch 112, the shape alloy material 302 may expand to fill the gaps 304 in the switch 112 and create a contact with the junction 111 nearest the heat pipe 104 to facilitate heat transfer between the heat exchanger 110 and the heat pipe 104. As the temperature decreases, e.g., below the predefined temperature threshold, the shape memory alloy 302 returns to its previous shape and removes contact with the junction 111 so that heat does not flow from the heat exchanger 110 to the heat pipe 104.

Figure 4:
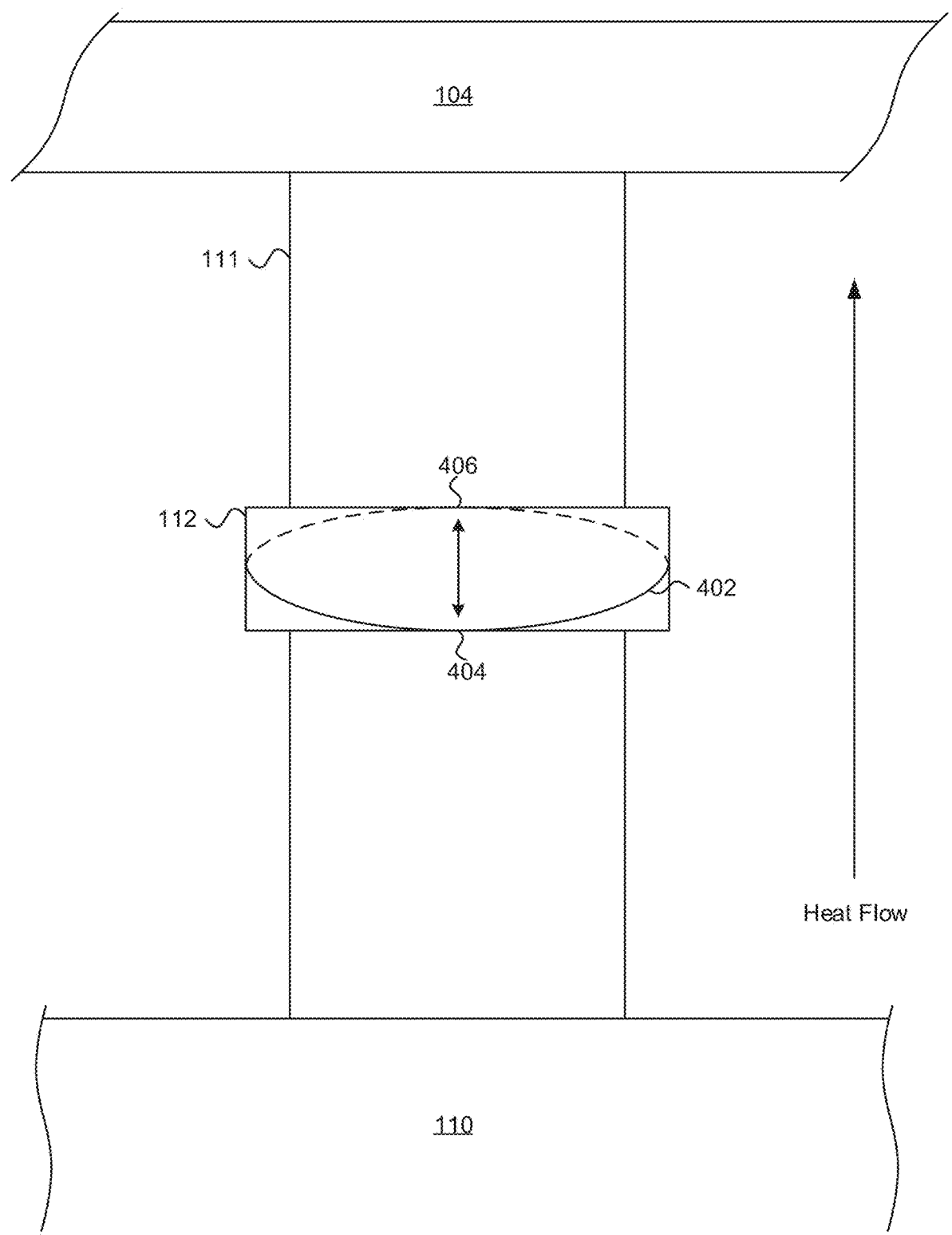
FIG. 4 is a schematic block diagram illustrating another embodiment of a thermal-activated switch in accordance with the subject matter disclosed herein.

FIG. 4 is a schematic block diagram illustrating another embodiment of a thermal-activated switch 112 in accordance with the subject matter disclosed herein. In one embodiment, the thermal-activated switch 112 may include a bi-metallic snap switch that snaps a material 402 into place, e.g., a second position 406, from a first position 404 to create contact between the heat exchanger 110 and the heat pipe 104, via the junction 111, in response to a temperature satisfying a predefined threshold temperature for the material 402.

For instance, as shown in FIG. 4, when the material 402 is directed/curved towards the heat exchanger 110 in the first position 404, there is no contact between the heat exchanger 110 and the heat pipe 104 via the junction 111. However, when the temperature reaches a predefined threshold temperature that causes the material to snap/curve towards the heat pipe 104 in the second position 406, the material 402 creates contact with the junction 111 and allows heat to flow from the heat exchanger to the heat pipe 104. As the temperature decreases, e.g., below the predefined temperature threshold, the material 402 returns to the first position 404 and removes contact with the junction 111 so that heat does not flow from the heat exchanger 110 to the heat pipe 104.

In one embodiment, the material 402 may comprise two metallic materials, such as the materials described above with reference to FIG. 2, that have different coefficients of expansion and are bonded to one another and at each end to the sides of the switch 112. When the temperature reaches the predefined threshold temperature, the material 402 snaps towards the heat pipe 104 in response to one of the two metallic materials expanding more than the other material. In the embodiment depicted in FIG. 4, the thermal-activated switch 112 has a height within a range of 1.0 mm and 1.5 mm, and, in some embodiments, has a height of 1.2 mm.

FIG. 5 is a schematic flow chart diagram illustrating embodiments of a heat exchanger 110. As described above, the shape, dimensions, thickness, and/or the like of the heat exchanger 110 (heat spreader or heat sink) may be dependent on the measured heat map or heat gradient of the battery 102 (or another electronic component). For instance, as the computing device 100 is used, the temperature of the battery 102, and/or other hardware components 108, may be monitored and tracked to determine the (average) heat map or heat gradient of the battery 102 over time as the computing device 100 is used. The heat map or heat gradient of the battery 102 may then be used to determine a design for the heat exchanger to efficiently and effectively dissipate heat from the hot regions or portions of the battery 102 and/or hardware components 108.

Thus, in one example embodiment 500, the heat exchanger 110 has a substantially consistent or even thickness and shape, which may be based on the battery 102 and/or hardware components 108 having an even or consistent heat map or heat gradient (meaning the battery 102 and/or hardware components 108 do not have portions that are hotter than other portions). For example, in such an embodiment, the battery cells 103 may each generate a substantially similar amount of heat such that the heat map is consistent across the battery 102.

In another example embodiment 510, the heat exchanger 110 gradually gets thicker from the center of the heat exchanger 110 towards the outermost portions based on the battery 102 and/or hardware components 108 generating more heat towards the outmost portions than near the center. For example, in such an embodiment, the battery cells 103 may create less heat towards the center of the battery 102 and the battery cells 103 may create more heat towards the outermost portions of the battery 102.

Similarly, in another example embodiment 520, the heat exchanger 110 is thicker towards the center of the battery 102 and/or hardware components 108 and gradually gets thinner towards the outermost portions based on the battery 102 and/or hardware components 108 generating more heat towards the center than the outermost portions. For example, in such an embodiment, the battery cells 103 may create more heat towards the center of the battery 102 and the battery cells 103 may create less heat towards the outermost portions of the battery 102.

One of skill in the art will recognize that the heat exchanger 110 may be designed to have various thicknesses, asymmetrical thicknesses, or the like based on the heat map/heat gradient of the battery 102 and/or hardware components 108.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus, comprising:
 a heat exchanger coupled to an electronic component to dissipate heat from the electronic component, wherein the heat exchanger is configured to dissipate more heat from hotter areas of the electronic component than cooler areas based on portions of the heat exchanger that cover hotter areas of the electronic component being thicker than other portions of the heat exchanger that cover cooler areas of the electronic component, wherein a top side of the heat exchanger varies in height above the electronic component, the top side distal to a bottom side coupled to the electronic component, and wherein portions of the bottom surface over the hotter areas of the electronic device are coplanar with portions of the bottom surface over the cooler areas of the electronic device;
a heat pipe connected to the heat exchanger and configured to dissipate heat; and
a thermal-activated switch coupled between the heat exchanger and the heat pipe, wherein the thermal-activated switch connects the heat exchanger to the heat pipe in response to a temperature satisfying a threshold temperature.

2. The apparatus of claim 1, wherein the thermal-activated switch is a one-way switch such that heat is transferred from the heat exchanger to the heat pipe and not from the heat pipe to the heat exchanger.

3. The apparatus of claim 1, wherein the heat exchanger substantially covers an external surface area of the electronic component.

4. The apparatus of claim 1, wherein the heat exchanger comprises a heat spreader.

5. The apparatus of claim 1, wherein the electronic component is free of a fan for dissipating heat.

6. The apparatus of claim 1, wherein the thermal-activated switch comprises a bi-metallic thermostat switch that comprises two materials that are bonded together and have different coefficients of expansion based on temperature to create contact between the heat exchanger and the heat pipe in response to the temperature satisfying the threshold temperature.

7. The apparatus of claim 1, wherein the thermal-activated switch comprises a shape memory switch comprised of a material that changes shape to create contact between the heat exchanger and the heat pipe in response to the temperature satisfying the threshold temperature.

8. The apparatus of claim 1, wherein the thermal-activated switch comprises a bi-metallic snap switch that snaps a material into place to create contact between the heat exchanger and the heat pipe in response to the temperature satisfying the threshold temperature.

9. The apparatus of claim 8, wherein the bi-metallic snap switch comprises:
a first side coupled to the heat exchanger;
a second side coupled to the heat pipe;
a gap between the first side and the second side; and
a thermally conductive material comprising a curved shape including a first end coupled to the first side and a second end coupled to the first side, the thermally conductive material configured to pivot around the first end and the second end to orient the curved shape toward the first side coupled to the heat exchanger in response to heat at the heat exchanger being less than a predetermined threshold amount of heat at the heat exchanger, and to orient the curved shape toward the second side coupled to the heat pipe to transfer heat from the heat exchange to the heat pipe in response to the heat at the heat exchanger being at least the predetermined threshold amount of heat.

10. The apparatus of claim 1, wherein the electronic component is a single electronic component and comprises one of a battery or a semiconductor device.

11. The apparatus of claim 1, wherein the threshold temperature is within a range of 60-70 degrees Celsius.

12. The apparatus of claim 11, wherein the threshold temperature is 65 degrees Celsius.

13. A system, comprising:
a first electronic component;
a second electronic component;
a first heat exchanger coupled to the first electronic component to dissipate heat from the first electronic component, wherein the heat exchanger is configured to dissipate more heat from hotter areas of the electronic component than cooler areas based on portions of the heat exchanger that cover hotter areas of the electronic component being thicker than other portions of the heat exchanger that cover cooler areas of the electronic component;
a second heat exchanger coupled to the second electronic component to dissipate heat from the second electronic component;
a heat pipe configured to dissipate heat; a first thermal-activated switch coupled between the first heat exchanger and the heat pipe, wherein the first thermal-activated switch connects the heat exchanger to the heat pipe in response to a temperature satisfying a first threshold temperature; and
a second thermal-activated switch coupled between the second heat exchanger and the heat pipe, wherein the second thermal-activated switch connects the heat exchanger to the heat pipe in response to a temperature satisfying a second threshold temperature.

14. The system of claim 13, wherein the first thermal-activated switch and/or the second thermal-activated comprises a bi-metallic thermostat switch that comprises two materials that are bonded together and have different coefficients of expansion based on temperature to create contact between the corresponding first or second heat exchanger and the heat pipe in response to the temperature satisfying the threshold temperature.

15. The system of claim 13, wherein the first thermal-activated switch and/or the second thermally activated switch comprises a shape memory switch comprised of a material that changes shape to create contact between the corresponding first or second heat exchanger and the heat pipe in response to the temperature satisfying the threshold temperature.

16. The system of claim 13, wherein the first thermal-activated switch and/or the second thermally-activated switch comprises a bi-metallic snap switch that snaps a material into place to create contact between the corresponding first or second heat exchanger and the heat pipe in response to the temperature satisfying the threshold temperature.

17. The system of claim 16, wherein the bi-metallic snap switch comprises:
a first side coupled to the heat exchanger;
a second side coupled to the heat pipe;
a gap between the first side and the second side; and
a thermally conductive material comprising a curved shape including a first end coupled to the first side and a second end coupled to the first side, the thermally conductive material configured to pivot around the first end and the second end to orient the curved shape toward the first side coupled to the heat exchanger in response to heat at the heat exchanger being less than a predetermined threshold amount of heat at the heat exchanger, and to orient the curved shape toward the second side coupled to the heat pipe to transfer heat from the heat exchange to the heat pipe in response to the heat at the heat exchanger being at least the predetermined threshold amount of heat.

18. A computing device, comprising:
a plurality of computing components, wherein at least a portion of the plurality of the computing components are each coupled to a heat exchanger without being coupled to a fan to dissipate heat; and a heat pipe for dissipating heat from the computing device; and a thermal-activated switch for each of the plurality of computing components, each thermal-activated switch coupled between a heat exchanger and the heat pipe and configured to connect the heat exchanger to the heat pipe to allow heat transfer from the heat exchanger to the heat pipe in response to a temperature of the thermal-activated heat switch satisfying a threshold temperature, wherein each heat exchanger of the portion of the plurality of computing components is configured to dissipate more heat from hotter areas of the computing component than cooler areas based on portions of the heat exchanger that cover hotter areas of the computing component being thicker than other portions of the heat exchanger that cover cooler areas of the computing component.

19. The computing device of claim 18, wherein each heat exchanger substantially covers an external surface area of the corresponding computing component.

\* \* \* \* \*